United States Patent [19]
Sabyeying

[11] Patent Number: 6,062,459
[45] Date of Patent: May 16, 2000

[54] WIRE BOND CLAMP

[75] Inventor: Watana Sabyeying, Nonthaburi, Thailand

[73] Assignee: Advanced Micro Devices, Inc., Sunnyvale, Calif.

[21] Appl. No.: 09/069,553

[22] Filed: Apr. 29, 1998

[51] Int. Cl.[7] .................................................. B23K 37/04
[52] U.S. Cl. ........................... 228/4.5; 228/44.7; 269/903
[58] Field of Search ................................... 228/212, 213, 228/6.2, 44.3, 44.7, 49.5, 4.5; 269/903

[56] References Cited

U.S. PATENT DOCUMENTS

| | | | |
|---|---|---|---|
| 4,765,531 | 8/1988 | Ricketson et al. | 228/180.5 |
| 5,035,034 | 7/1991 | Cotney | 29/25.01 |
| 5,116,031 | 5/1992 | Takeuchi et al. | 269/87.3 |
| 5,193,733 | 3/1993 | You | 228/4.5 |
| 5,249,726 | 10/1993 | Sato | 228/6.2 |
| 5,322,207 | 6/1994 | Fogal et al. | 228/180.5 |
| 5,791,549 | 8/1998 | Ito | 228/1.1 |
| 5,813,590 | 9/1998 | Fogal et al. | 228/4.5 |
| 5,826,778 | 10/1998 | Sato et al. | 228/44.7 |
| 5,890,644 | 4/1999 | Ball | 228/44.7 |
| 5,915,749 | 6/1999 | Baldwin | 29/593 |

*Primary Examiner*—Samuel M. Heinrich
*Attorney, Agent, or Firm*—Fliesler, Dubb, Meyer & Lovejoy LLP

[57] ABSTRACT

A wire bond clamp for holding lead frame fingers of a plurality of lead frames against a heater block so that electrical connections may be made between the lead frames and IC components. The wire bond clamp includes a baseplate having a plurality of openings. Each of the openings are provided for receiving a clamping insert, which insert has a central aperture therethrough and jaws surrounding the central aperture on a bottom surface of the insert. The central apertures on each clamping insert are sized and positioned so that during a wire bond process, the wire bond clamp may be lowered over a plurality of lead frames and IC components, and tips of the lead frame fingers and the IC components will be located within the central apertures. The jaws of each clamping insert are provided to engage each of the lead frame fingers, and to hold each of the fingers against the heater block. The wire bond clamp further includes mounting pins for pivotally mounting the clamping inserts in the baseplate, and leaf springs for spring loading the clamping inserts downward toward the direction of the lead frames. The spring loaded and pivotal mounting of the clamping inserts in the baseplate allow the inserts to move independently of the baseplate and each other Thus, any deformation in the baseplate is prevented from being transferred to the clamping inserts.

12 Claims, 7 Drawing Sheets

2

WIRE BOND CLAMP

BACKGROUND OF THE INVENTION

1. Field of the Invention

The present invention relates to a system for making electrical connections between an integrated circuit component and a lead frame to which the component is attached, and in particular to a clamp for uniformly securing fingers of variable-sized lead frames in the proper position for bonding of an electrical wire connection thereto.

2. Description of Related Art

In fabricating a semiconductor device, the integrated circuit (IC) component will typically be affixed to a die attach pad at the center of a lead frame, or otherwise stationarily mounted with respect to the lead frame. Thereafter, electrical connections are established between points on the IC component and the individual fingers of the lead frame. As disclosed for example in U.S. Pat. No. 3,806,019 to Diepeveen, wire bonders are known for attaching a first end of an electrically conductive wire to a point on an IC component, and for thereafter attaching a second end of the wire to a selected finger of the lead frame. The ends of the electrical wire may be bonded to the IC component and the individual fingers of the lead frame ultrasonically and/or by heat welding.

FIGS. 1A and 1B show a heater block 24 and clamp 26 supporting an IC component 20 and lead frame 22 during a wire bond process. The clamp 26 is provided to hold individual fingers 22a of the lead frame down on the heater block while a wire 27 is bonded between the IC component and the lead frame. The clamp and heater block fix the position of the IC component and lead frame for the wire bonder, and the heater block further heats the fingers 22a to facilitate the wire bond connection to the lead frame fingers.

It is extremely important that the clamps 26 engage each finger of the lead frame to press the individual fingers against the heater block 24. If the clamp does not hold a particular finger 22a flush against the heater block, unintentional movement of the finger may occur, thereby impeding the ultrasonic weld and preventing good heat transfer from the heater block to the finger. All of this may lead to poor adhesion of the electrical connection on the lead frame finger. A poorly adhered electrical connection may exhibit different electrical conductive properties than other electrical connections. Of further significance, a poorly adhered electrical connection may escape detection during fabrication, and then break once the semiconductor device is operating in a customer's system. Breaking of the electrical connection could cause severe malfunction of the customer's system, and is extremely difficult to locate.

As shown in FIG. 1A, a clamp 26 includes an aperture into which the ends of the lead frame fingers 22a extend, adjacent the IC component 20. Clamp 26 includes a jaw 26a for engaging the ends of the lead frame fingers. Although clamp 26 is shown with a single aperture in FIG. 1A, it is typical that a single clamp may include more than one such aperture so that electrical connections between a plurality of IC components and lead frames may be done in a single wire bonding process. However, it is a severe limitation to conventional wire bond clamps that the temperature and pressure cause the clamps to deform over time. Even slight deformation of the clamp could lead to a poor electrical bond between the IC component and at least some of the lead frame fingers. As shown for example in FIG. 1B, deformation of a clamp 26 can prevent jaw 26a of the clamp from contacting one or more of the lead frame fingers 22a, and thus the finger 22a is not fixed against the heater block. While making the clamp small lessens the degree to which they will deform, using small clamps limits the number of IC component and lead frame pairs which may be electrically connected in a single wire bond process.

Another shortcoming of the prior art relates to the necessity for realignment of the clamp to the lead frame and IC component each time the clamp is changed. IC components, and the open space at the center of a lead frame for the IC components, vary in size. However, conventional wire bond clamps have apertures of a fixed size. Therefore, when it was desired to change the size of the IC component and lead frame, it was necessary to remove the clamp 26 and replace it with a new clamp having apertures appropriate for the new IC component and lead frame. Conventional wire bond clamps have been mounted to the wire bonder by a plurality of screws. In order to replace a wire bond clamp, the screws had to be removed, a new clamp sized for the new IC components and lead frame mounted on the wire bonder, and the screws reapplied. In addition to being time consuming, it has been necessary to realign the clamp to ensure that the X-Y axes are properly aligned to the X-Y axes of the IC component and lead frame. Any misalignment could result in uneven, poor and/or ineffective electrical connections between the IC component and the fingers of the lead frame.

A further disadvantage of conventional clamps that are capable of clamping more than one lead frame at a time is that if the jaws clamping one of the lead frames became damaged, the entire clamp had to be removed and replaced by a new clamp. This is true even if the other jaws of the clamp were not damaged.

SUMMARY OF THE INVENTION

It is therefore an advantage of the present invention to provide a wire bond clamp for uniformly securing fingers of a lead frame against a heater block during a wire bond process.

It is another advantage of the present invention to provide a wire bond clamp which is durable and capable of providing uniform and strong electrical connections between an IC component and a lead frame.

It is a further advantage of the present invention to provide a wire bond clamp capable of securing a large number of IC component and lead frame pairs to a heater block in a single wire bond process.

It is another advantage of the present invention to provide a wire bond clamp which may be used with varying sizes of IC components and lead frames.

It is a still further advantage of the present invention to provide a wire bond clamp having X-Y axes which remain aligned with the X-Y axes of an IC component and lead frame even after the size of the component and lead frame has been changed relative to a previous wire bond process.

It is another advantage of the present invention that where the mechanisms for clamping one lead frame become damaged, those mechanisms may be removed without having to remove the entire clamp.

These and other advantages are accomplished by the present invention, which in preferred embodiments relates to a wire bond clamp for holding lead frame fingers of a plurality of lead frames against a heater block so that electrical connections may be made between the lead frames and IC components. The wire bond clamp includes a baseplate having a plurality of openings. Each of the openings are provided for receiving a clamping insert, which insert has a central aperture therethrough and jaws surrounding the central aperture on a bottom surface of the insert. The central apertures on each clamping insert are sized and positioned so that during a wire bond process, the wire bond clamp may be lowered over a plurality of lead frames and IC components, and tips of the lead frame fingers and the IC components will be located within the central apertures. The jaws of each clamping insert are provided to engage each of the lead frame fingers, and to hold each of the fingers against the heater block.

Each clamping insert is pivotally mounted within the baseplate openings by means of a pair of axially-aligned mounting pins protruding from the sides of the insert. The wire bond clamp further includes a plurality of leaf springs for spring loading the clamping inserts downward toward the direction of the lead frames. In operation, as the wire bond clamp is brought down over the IC components, and the clamping inserts engage their respective lead frames, a lead frame will exert a force upward against the jaw of a clamping insert engaged therewith to slightly displace the clamping insert, against the force of the leaf springs, with respect to the baseplate.

The spring loaded and pivotal mounting of the clamping inserts in the baseplate allow the inserts to move independently of the baseplate and each other Thus, any deformation in the baseplate is prevented from being transferred to the clamping inserts. In the event deformation of the baseplate has occurred so that the baseplate is not parallel to the lead frame, the leaf springs and mounting pins act to spread the contact forces between the jaws and lead frame fingers evenly and uniformly around the line of contact between the jaws and lead frame. The result is that the inserts will lie flat on top of the lead frames, and will uniformly exert a force on each of the lead frame fingers to hold each of the fingers against the heater block.

The leaf springs are held in the baseplate by means of a locking pin. It is a further feature that the individual clamping inserts may be removed and replaced, without removing the baseplate, when the size of the IC component and lead frame are changed. Thus, the clamp according to the present invention remains continuously aligned with the IC component and lead frame.

BRIEF DESCRIPTION OF THE DRAWINGS

The present invention will now be described with reference to the drawings in which.

DETAILED DESCRIPTION

Figure 1A:
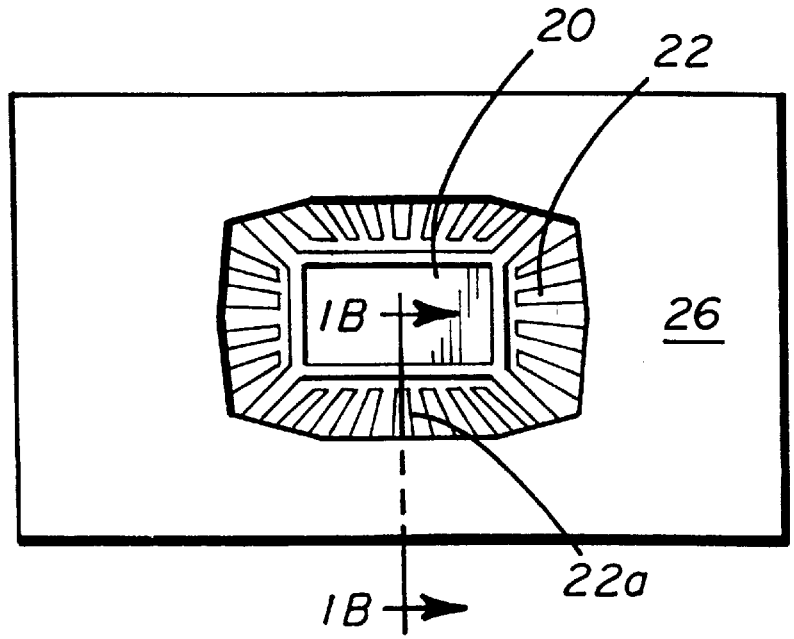
FIG. 1A is a top view of a conventional wire bond clamp securing the lead frame in position with respect to an IC component during the wire bond process.

The present invention will now be described with reference to FIGS. 2–7, which in general relate to a wire bond clamp for securing a plurality of lead frames in proper position with respect to an IC component to allow a wire bond connection to be established therebetween. FIGS. 2–7 in general show a wire bond clamp 100 according to the present invention, including a baseplate 102 and a plurality of clamping inserts 104 fitting within openings 106 in the baseplate 102. The wire bond clamp 100 further includes leaf springs 108 and mounting pins 110 for mounting the clamping inserts 104 in baseplate 102, and locking pin 112 for locking the leaf springs 108 in the baseplate 102. Each of the above-named components and their interaction is set forth hereinafter. The wire bond clamp 100 may operate together with a heater block 113 to secure a lead frame 115 and an IC component 117 in position for bonding of a conductive wire therebetween by a wire bonder (not shown).

Baseplate 102 is preferably formed of steel and may be fabricated by casting or extrusion and machining. It is understood that baseplate 102 may be formed of various other high strength materials and by various other processes in alternative embodiments of the invention. As shown in the figures, baseplate 102 includes four openings 106, each of which is provided for receiving a lead frame and IC circuit pair. Thus, the illustrated embodiment is capable of clamping four lead frames at a time. It is understood that the number of openings 106 may be larger or smaller in alternative embodiments of the invention. For example, a clamp 100 according to alternative embodiments of the present invention may include only a single opening 106, and in further embodiments of the present invention may include 8 or more openings 106. The size and shape of each of the openings 104 are preferably identical to each other.

Baseplate 102 further includes flange portions 114 and 116 which allow the wire bond clamp 100 to be gripped by an indexer (not shown) on a wire bonder which moves the wire bond clamp between a first position in engagement with a lead frame and adjacent a heater block, and a second position where the clamp does not engage a lead frame and is spaced from the heater block. In a preferred embodiment, the movement between the first and second positions comprises vertical translation, but it is understood that translation along other axes is also possible. The clamp 100 may be removably affixed to the indexer by screws, or may snap into position on the indexer Clamping inserts 104 are provided to fit within openings 106 in the baseplate 102, one clamping insert for each opening. The size and shape of the outer circumference of clamping inserts 104 is provided such that the inserts fit snugly within the openings 106. Although the openings 106 and the outer circumference of clamping inserts 104 are shown as rectangular in the drawings, it is understood that the shape of the openings and outer circumference of the clamping inserts may vary in alternative embodiments of the invention. Moreover, it is understood that the clamping inserts 104 need not fit snugly within the openings 106 in alternative embodiments of the invention. In these alternative embodiments, other means must be provided for stabilizing the inserts within the openings. As with baseplate 102, each clamping insert is preferably formed of steel or some other high strength material, and may be fabricated by casting or extrusion and machining. Each of the clamping inserts 104 are preferably identical to each other in a preferred embodiment.

Each of the clamping inserts 104 includes a central aperture. The central apertures 118 are sized and positioned so that during a wire bond process, the clamp 100 may be lowered over a plurality of lead frames and IC components (four in the illustrated embodiment), and tips of the lead frame fingers and the IC components will be located within the central apertures 118. In this way, the wire bonder can connect a wire from the IC component to the exposed portions of the lead frame fingers within central apertures 118.

On the underside of the clamping inserts 104 (i.e., the side adjacent the lead frame), the central aperture 118 of each clamping insert is substantially or completely surrounded by jaws 120. As shown in the bottom view of a clamping insert in FIG. 5, jaws 120 comprise a ridge which protrudes away from a bottom surface of each of the clamping inserts. The jaws 120 of each clamping insert 104 are provided to engage each of the fingers 115a (FIG. 2) of the lead frames 115 to be electrically connected to the IC components 117, and to hold each of the fingers against the heater block 113. In a preferred embodiment, the jaw 120 of each clamping insert lies along an inner circumferential edge of the bottom surface of the clamping inserts, which inner circumferential edge defines the central aperture 118. This configuration allows the jaws 120 to clamp the lead frame fingers nearest to the portion of the fingers on which the wire bond is made. It is understood, however, that in alternative embodiments of the invention, the jaws 120 on each clamping insert 104 may be spaced slightly away from the inner circumferential edge of the bottom surface of the clamping inserts which define the central apertures 118. In a preferred embodiment, the jaws 120 may be formed integrally with the clamping insert during the insert casting or machining process. However, in alternative embodiments of the invention, the jaws 120 may be formed of a high temperature rubber, or various other polymers, affixed to the clamping insert after the insert is formed.

The clamping inserts preferably include tapered walls which define the central aperture through the inserts. The walls are tapered inward so that the circumference of the central aperture 118 at a top surface of the clamping inserts is larger than the circumference of the central aperture 118 at a bottom surface of the clamping inserts. The tapered walls facilitate access to the lead frame fingers by the wire bonder. It is understood that the walls need not be tapered in alternative embodiments of the invention.

As explained in the Background of the Invention section, the semiconductor fabrication processes involve IC components and lead frames of differing sizes. With conventional wire bond clamps, when the size of the IC components and lead frames were changed, the entire wire bond clamp had to be removed from the wire bonder and a new wire bond clamp substituted therefor. It is important to maintain a small and fixed distance between the clamping jaw of the wire bond clamp and the wire bond location on the lead frame fingers. Thus, where the IC component, and the space for the IC component at the center of the lead frame, were made smaller or larger, the circumference of the jaw and central clamp opening had to be made correspondingly smaller or larger.

When the wire bond clamp is removed and replaced by a new clamp, realignment of the wire bond clamp with respect to the lead frames was required to ensure that the X-Y axes of the wire bond clamp remained aligned to and parallel with the X-Y axes of the lead frames. It is a feature of the present invention that when the size of the IC components and lead frames being fabricated changes, no removal of the wire bond clamp 100 is necessary. Thus, the X-Y axes of wire bond clamp 100 remain continuously aligned with and parallel to the X-Y axes of the semiconductor package being fabricated.

In particular, when the size of an IC component changes, for example, from a larger to a smaller IC component, each of the clamping inserts 104 may be removed from the baseplate (as explained hereinafter) and replaced by new clamping inserts having smaller central apertures. Thus, the portion of the lead frame fingers extending into the central apertures 118 remains relatively constant regardless of the size of the IC component or the size of the opening defined by the inner ends of the lead frame fingers. Similarly, where the size of an IC component changes to a larger IC component, the size of the central aperture 118 will become larger. Although the size of the central apertures 118 in each of the clamping inserts 104 will vary with a change in size of the IC component being fabricated, the outer circumference of the clamping inserts preferably remains the same so as to fit snugly within the openings 106 formed in the baseplate 102.

Additionally, in the event that only one of the inserts 104 becomes damaged for any reason, that particular insert may be easily removed (as explained hereinafter) and replaced by a new insert, without having to remove and replace the other clamping inserts or clamp as a whole.

Figure 1B:
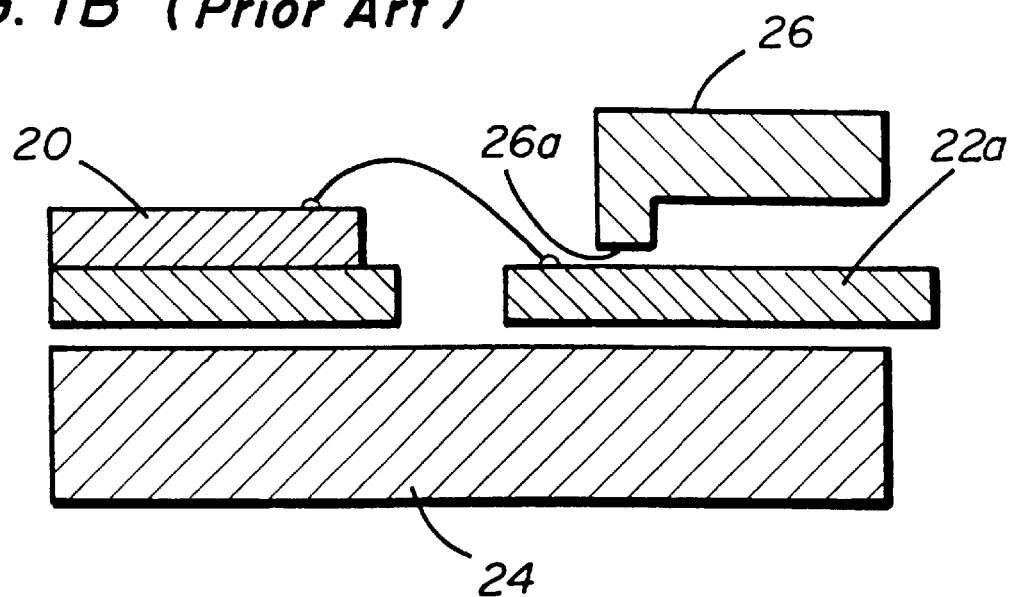
FIG. 1B is a cross-sectional view through line A—A on FIG. 1A.
Figure 2:
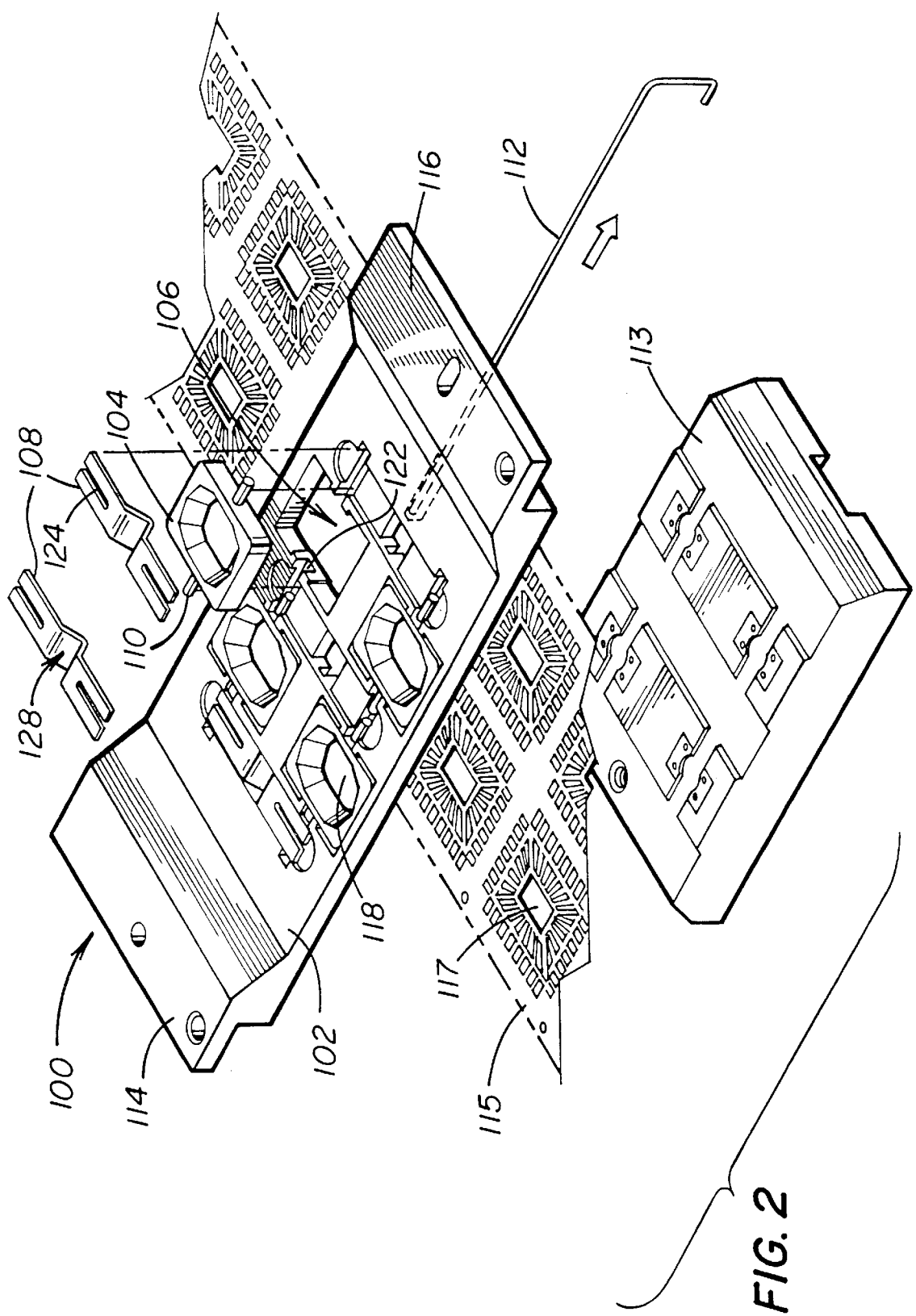
FIG. 2 is an exploded perspective view of a wire bond clamp according to the present invention.
Figure 3:
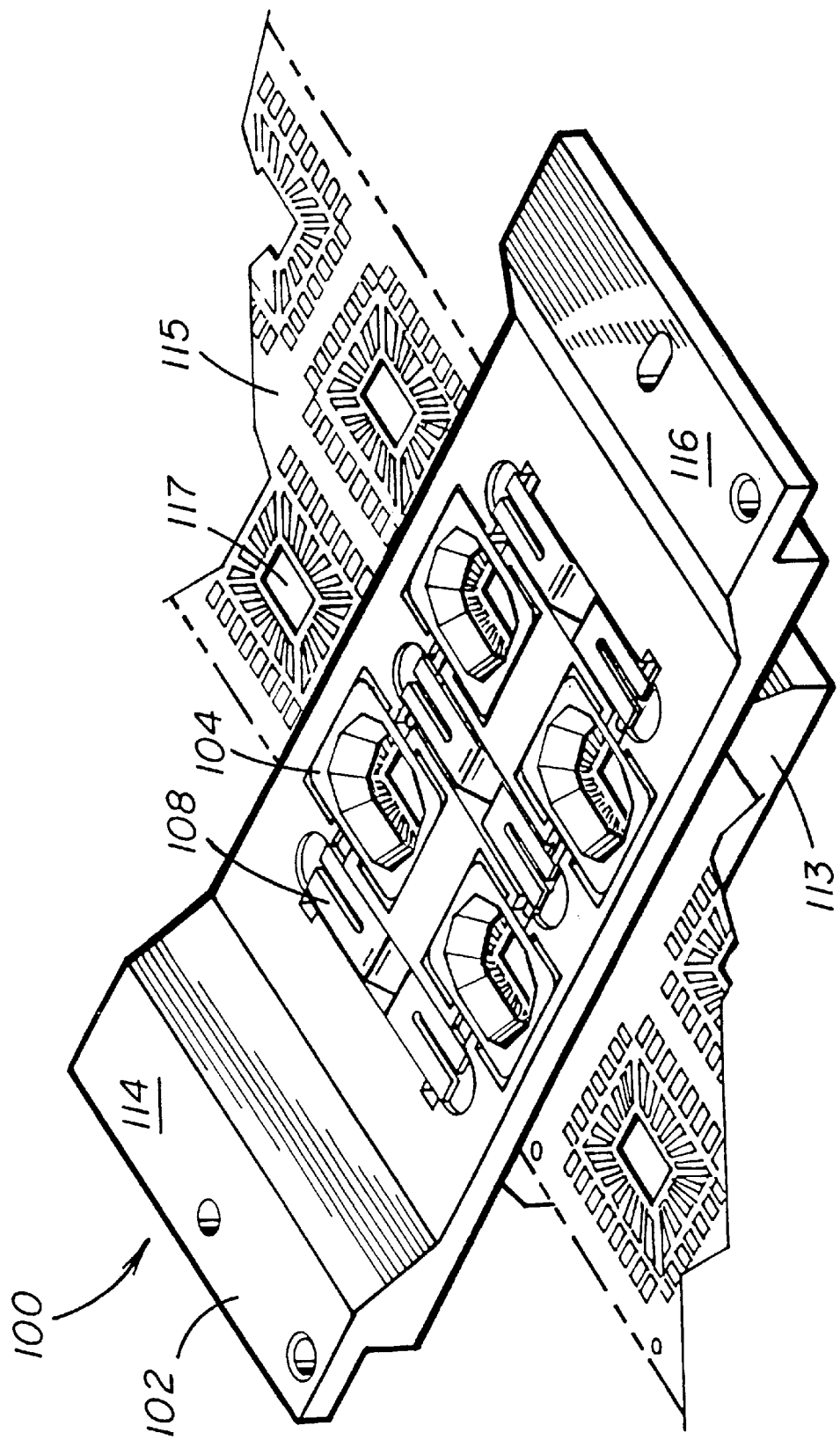
FIG. 3 is a perspective view of a wire bond clamp according to the present invention.

Each of the clamping inserts 104 are held within baseplate 102 by the plurality of leaf springs 108. As best seen in FIG. 1, mounting pins 110 are preferably affixed to the clamping inserts 104 along a common axis by welding or other known fastening methods, so that a portion of the mounting pins 110 extend outward from the outer circumference of the clamping inserts. The mounting pins extending from the sides of the clamping inserts fit within grooves 122 formed in the upper surface of the baseplate 102. The mounting pins 110 within grooves 122 support the clamping inserts on the baseplate, but do not prevent the clamping inserts 104 from being lifted up out of the openings 106.

Figure 6:
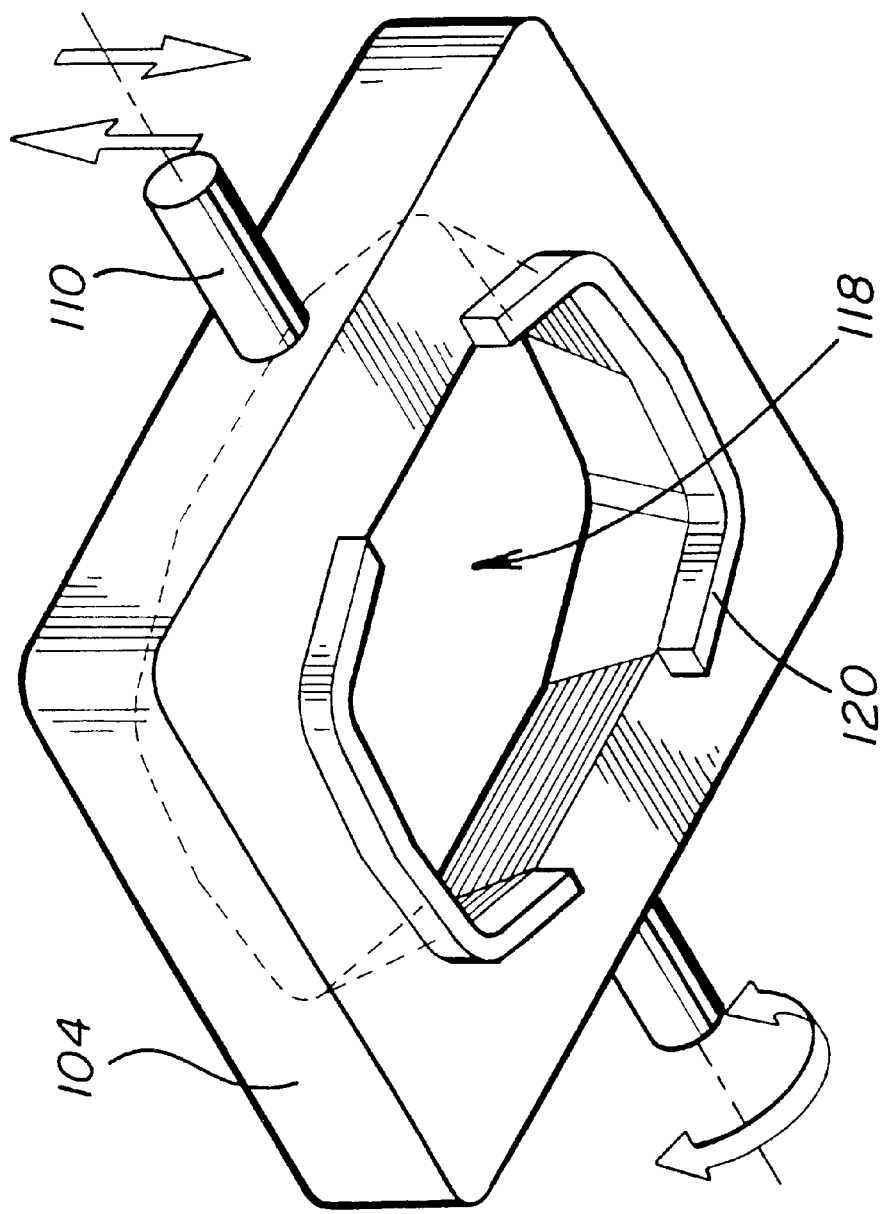
FIG. 6 is a perspective view of a clamping insert according to the present invention.
Figure 7A:
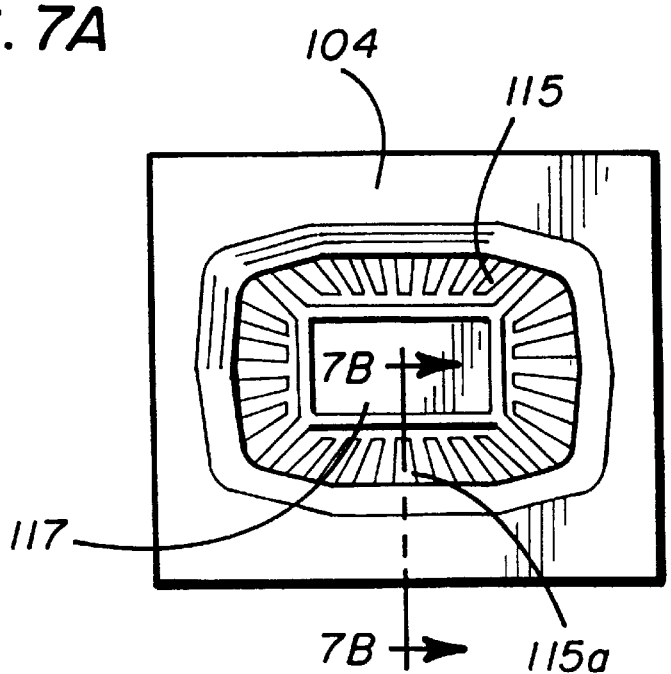
FIG. 7 is a cross-sectional view through line 7—7 on FIG. 4.
Figure 7B:
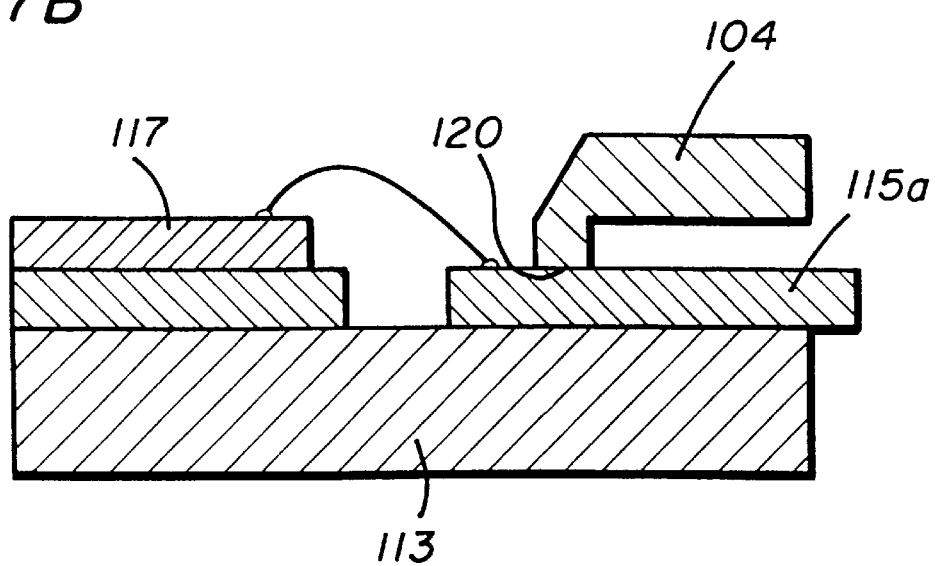

The clamping inserts 104 are biased in a downward direction (i.e., toward the lead frame) via the plurality of leaf springs 108. In operation, as the wire bond clamp 100 is brought down over the IC components, and the clamping inserts engage their respective lead frames, a lead frame will exert a force upward against the jaw of a clamping insert engaged therewith to slightly displace the clamping insert, against the force of the leaf springs, with respect to the baseplate. As shown in FIG. 6, the spring loading of the clamping insert allows the insert to move up and down (all sides of the insert together or one side to a greater extent than another) with respect to the baseplate, and the mounting pins 110 allow the insert to pivot with respect to the baseplate. Additionally, in alternative embodiments of the invention, the baseplate may be able to pivot slightly along its length and/or width with respect to the indexer on which the clamp is mounted.

The spring loaded and pivotal mounting of the clamping inserts in the baseplate allow the inserts to move independently of the baseplate and each other. The inserts in effect "float" in the baseplate. Thus, any deformation in the baseplate is prevented from being transferred to the clamping inserts. In the event deformation of the baseplate has occurred so that the baseplate is not parallel to the lead frame, the leaf springs and mounting pins act to spread the contact forces between the jaws and lead frame fingers evenly and uniformly around the line of contact between the jaws and lead frame. The result is that the inserts will lie flat on top of the lead frames, and will uniformly exert a force on each of the lead frame fingers to hold each of the fingers against the heater block. Moreover, as each clamping insert is independently suspended in the baseplate, each insert may be independently aligned with respect to the lead frame clamped thereby.

Figure 4:
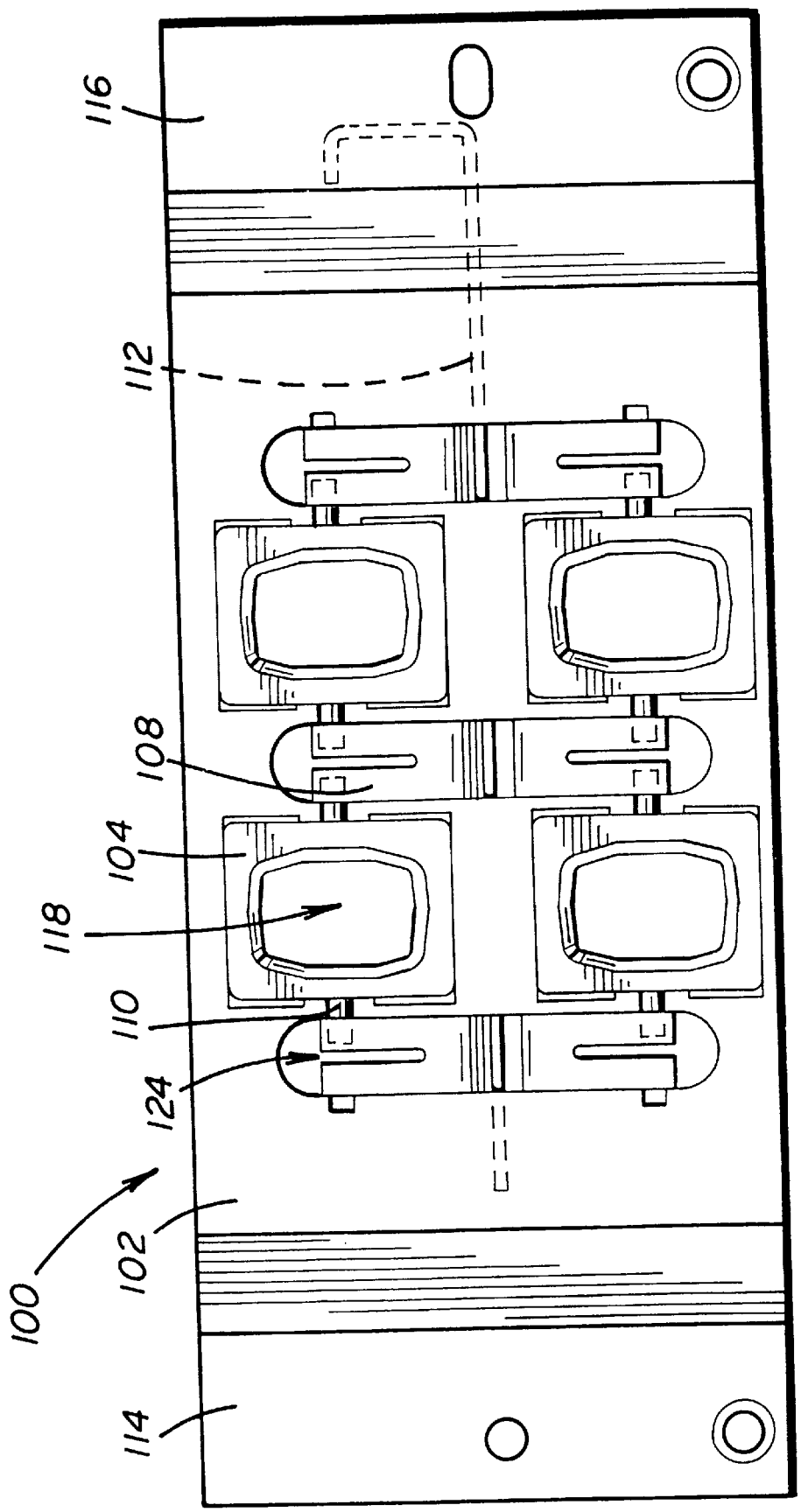
FIG. 4 is a top view of a wire bond clamp according to the present invention.

In a preferred embodiment, as shown for example by the leftmost and rightmost leaf springs in FIG. 4, a single leaf spring may engage a mounting pin 110 from two separate end-to-end clamping inserts 104, at a top and a bottom of the leaf spring. Additionally, as shown for example by the center leaf spring in FIG. 4, each end of the leaf spring may engage the mounting pin of two separate side-by-side clamping inserts. A slit 124 is provided inwards from both ends of each of the leaf springs so that the leaf springs may provide independent spring loading and suspension of each of the clamping inserts engaged by a particular leaf spring. As would be appreciated by those of skill in the art, each of the clamping inserts 104 may be independently spring loaded and suspended within the baseplate 102 by methods other than that shown in the Figures and described above.

Figure 5:
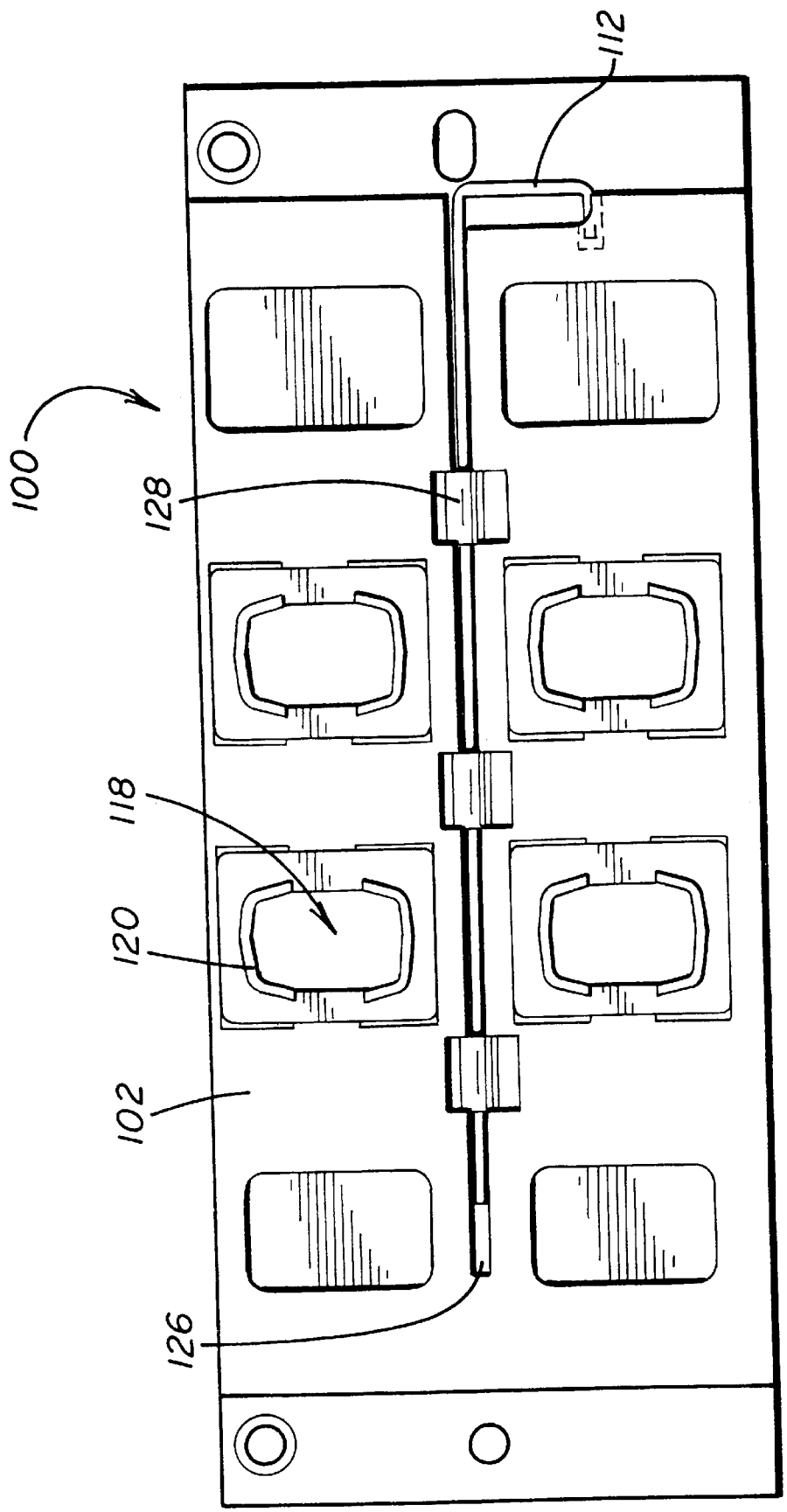
FIG. 5 is a bottom view of a wire bond clamp according to the present invention.

As shown on the top view of FIG. 4 and the bottom view of FIG. 5, the locking pin 112 may fit within a channel 126 on an underside of the baseplate. Each of the leaf springs includes a central portion 128 recessed with respect to the major planar surface of the leaf springs. The central recessed portion of each leaf spring resides in a hole in the baseplate so that the central recessed portion extends into the channel 126. Once the leaf springs are located on baseplate 102 in engagement with mounting pins 110, the locking pin 112 can be slid into channel 126 and over the central recessed sections 128 to thereby lock the leaf springs 108 and clamping inserts 104 in position on the baseplate 102.

When it is desired to change the clamping inserts 104 for smaller or larger IC components, locking pin 112 may be removed from channel 126, to thereby free the leaf springs 108 and clamping inserts 104. Upon selection of the new clamping inserts, the inserts may be affixed to the baseplate by mounting pins 110 being located within the appropriate grooves 122, the leaf springs 108 placed thereover, and the locking pin reinserted into channel 126 over central recessed sections 128 to complete reassembly of the wire bond clamp. As would be appreciated by those of skill in the art, mechanisms other than locking pin 112 may be used to secure the leaf springs 108 within baseplate 102.

In operation, when an electrical connection is to be made by a wire bonder between the IC component 117 and the fingers of the lead frame 115, a group of four (in one embodiment) IC components and lead frames are positioned on the heater block 113, and a clamp 100 according to the present invention is lowered thereover to secure the IC component and lead frame in bonding position. As shown in the cross-sectional side view in FIG. 7, the wire bond clamp according to the present invention ensures that the jaws 120 secure the fingers 115a of the lead frame against the heater block. Thus, heat is effectively transferred from the heater block 113 to the fingers 115a, and a strong wire bond connection may be made by heat and/or ultrasonic welding.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appending claims.

I claim:

1. A wire bond clamp for clamping a plurality of fingers of at least one lead frame for electrical connection to at least one integrated circuit component, comprising:

a baseplate including at least one opening; and at least one clamping insert movably affixed within said at least one opening, said at least one clamping insert capable of being displaced by said plurality of fingers of said at least one lead frame upon contact between the clamp and at least one lead frame.

2. A wire bond clamp for fixing the position of a plurality of fingers of a plurality of lead frames for electrical connection to a plurality of integrated circuit components, comprising:

a baseplate;

a plurality of clamping inserts mounted to said baseplate, said plurality of clamping inserts capable of clamping the plurality of fingers of the plurality of lead frames, a first clamping insert of said plurality of clamping inserts a first clamping insert capable of being displaced a different amount than a second clamping insert upon contact of said first and second clamping inserts with the plurality of fingers of the plurality of lead frames.

3. A wire bond clamp for fixing the position of a plurality of fingers of at least one lead frame for electrical connection to at least one integrated circuit component, comprising:

a baseplate including at least one opening;

at least one clamping insert capable of being positioned within said at least one opening in said baseplate, said at least one clamping insert having a portion on a bottom surface of said at least one clamping insert capable of engaging the plurality of fingers of the at least one lead frame; and means for mounting said at least one clamping insert in said baseplate such that said at least one clamping insert is capable of moving independently of said baseplate upon contact of said at least one clamping insert with the plurality of fingers of the at least one lead frame.

4. A wire bond clamp for fixing the position of a plurality of fingers of at least one lead frame for electrical connection to at least one integrated circuit component, comprising:

a baseplate including at least one opening;

at least one clamping insert capable of being positioned within said at least one opening in said baseplate, said at least one clamping insert having a portion on a bottom surface of said at least one clamping insert capable of engaging the plurality of fingers of the at least one lead frame; and means for mounting said at least one clamping insert in said baseplate such that said at least one clamping insert is capable of moving independently of said baseplate, wherein said mounting means comprise pins affixed to said at least one clamping insert and capable of engaging said baseplate to pivotally mount said at least one clamping insert with respect to said baseplate.

5. A wire bond clamp as recited in claim 3, wherein said mounting means comprise at least one spring having a first portion engaging said baseplate and a second portion engaging said at least one clamping insert.

6. A wire bond clamp as recited in claim 3, wherein said at least one clamping insert is removable.

7. A wire bond clamp as recited in claim 3, wherein said at least one clamping insert comprises first and second clamping inserts, and the at least one lead frame comprises first and second lead frames, said first clamping insert capable of clamping the first lead frame independently of said second clamping insert clamping the second lead frame.

8. A wire bond clamp for fixing the position of a plurality of fingers of at least one lead frame for electrical connection to at least one integrated circuit component, comprising:

a baseplate including at least one opening;

at least one clamping insert capable of being positioned within said at least one opening in said baseplate, said at least one clamping insert having a portion on a bottom surface of said at least one clamping insert capable of engaging the plurality of fingers of the at least one lead frame;

a spring, capable of being mounted within said baseplate, for mounting said at least one clamping insert to said baseplate, such that said at least one clamping insert is capable of moving with respect to said baseplate against a force of said spring; and a locking pin, capable of being removably mounted within said baseplate, for mounting said spring within said baseplate.

9. A wire bond clamp as recited in claim 8, wherein removal of said locking pin allows said spring to be removed from said baseplate.

10. A wire bond clamp as recited in claim 9, wherein removal of said spring allows said at least one clamping insert to be removed from said baseplate.

11. A wire bond clamp as recited in claim 8, wherein said at least one clamping insert comprises first and second clamping inserts, and the at least one lead frame comprises first and second lead frames, said first clamping insert capable of clamping the first lead frame independently of said second clamping insert clamping the second lead frame.

12. A wire bond clamp for clamping a plurality of fingers of at least one lead frame for electrical connection to at least one integrated circuit component, comprising:

a baseplate including at least one opening;

at least one clamping insert fitting within said at least one opening; and at least one spring for mounting said at least one clamping insert in said at least one opening and at all times allowing said at lest one clamping insert to move within said at least one opening.

* * * * *